Oct. 31, 1961 F. H. GERHARD 3,007,116

CHOPPER STABILIZED DIRECT CURRENT AMPLIFIER

Filed April 30, 1959 3 Sheets-Sheet 1

INVENTOR.
FRANCIS H. GERHARD
BY
AGENT

CHOPPER STABILIZED DIRECT CURRENT AMPLIFIER

Filed April 30, 1959 3 Sheets-Sheet 2

INVENTOR.
FRANCIS H GERHARD

BY Edward A. Sokolski

AGENT

Oct. 31, 1961 F. H. GERHARD 3,007,116

CHOPPER STABILIZED DIRECT CURRENT AMPLIFIER

Filed April 30, 1959 3 Sheets-Sheet 3

INVENTOR.
FRANCIS H. GERHARD

BY *Edward A. Sokolski*

AGENT

United States Patent Office 3,007,116

Patented Oct. 31, 1961

3,007,116

CHOPPER STABILIZED DIRECT CURRENT AMPLIFIER

Francis H. Gerhard, Lakewood, Calif., assignor to North American Aviation, Inc.

Filed Apr. 30, 1959, Ser. No. 810,105
4 Claims. (Cl. 330—10)

Figure 1:
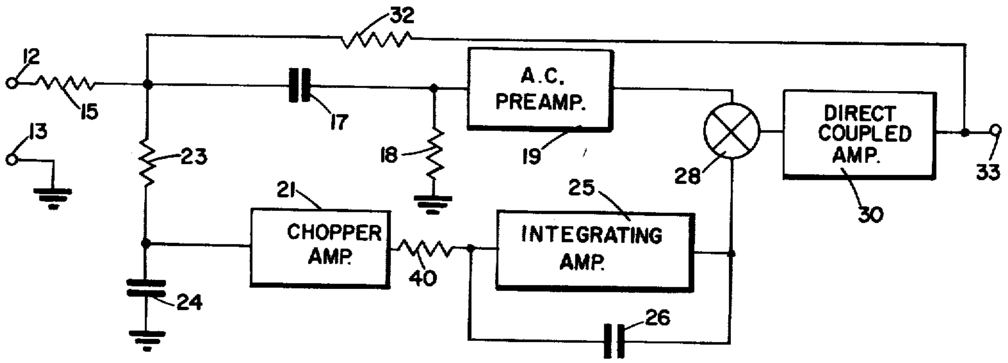

This invention relates to direct current amplifiers and more particularly to a chopper stabilized direct current amplifier having extremely low direct current drift, good gain stability, and which is suitable for use in completely transistorized circuitry.

Direct current amplifiers are widely used in analogue computers, digital to analogue converters, and other systems for such purposes as voltage or current summation, phase inversion, differentiation, integration, and voltage or current regulation. In many applications where high precision is necessary, it is essential that the amplifier meet very stringent gain stability and low direct current drift requirements. Direct current amplifiers are known in the art which achieve gain stability and low drift by applying large amounts of negative feedback from the output of the amplifier to the input and by using a chopper amplifier for amplifying the very low frequency and direct current components of the input signal.

In chopper stabilized direct current amplifiers, as is well known in the art, an extremely long time constant filter (around 20 seconds) must generally be used in the amplifier circuit. This means that unless high capacitance capacitors (which are generally quite bulky) are utilized, a resistor of at least several megohms must generally be used in the filter to achieve the necessary response characteristics. This high resistance resistor must appear in the input circuitry of one of the amplifier stages which is generally the grid of a vacuum tube or the base of a transistor. Even an extremely small grid current in a vacuum tube or base current in a transistor can produce a significant voltage across such a high resistance resistor. Such grid and base currents will generally vary with temperature and other outside influences and the resultant bias drift errors can be great enough to seriously impair the accuracy of the direct current amplifier. While such bias drift errors are significant in vacuum tube circuitry, they are even more noticeable in transistor circuitry where, as is well known in the art, the variations in base current with temperature may be of appreciable significance where the base input resistance is high. This factor has made it difficult or impossible in precision applications to use completely transistorized direct coupled amplifiers (which have the advantages of compactness, improved reliability and low heat dissipation) even where relatively low drift silicon type transistors are used.

The device of this invention has overcome this problem by utilizing an integrating amplifier adapted to function as a low pass filter in place of the conventional R-C filter. The device of this invention also incorporates an alternating current preamplifier for alternating current components of the input signal. The use of such a preamplifier permits the use of a lower attentuation filter in the chopper amplifier circuitry for a given design requirement and thereby facilitates the design of this circuitry as well as lending to an overall improvement in drift characteristics.

A preferred embodiment of this invention provides two channels, one for amplifying substantially only the alternating current components of the input signal above a predetermined crossover frequency, the other channel for amplifying substantially only the low frequency and direct current components of the input signal below this crossover frequency. Direct current components are isolated from the alternating current channel by a simple R-C network. The alternating current components are filtered out of the direct current channel by an integrating amplifier. The outputs of the two channels are summed and the summed signal is sent to a direct coupled amplifier. Stability is achieved by feeding very large amounts of negative feedback from the output of the direct coupled output amplifier to the inputs of both channels.

It is therefore an object of this invention to provide an improved direct current amplifier.

It is a further object of this invention to improve the stability and low drift characteristics of direct current amplifiers.

It is a still further object of this invention to provide an improved direct current amplifier which is especially suited for use in completely transistorized circuitry.

It is still another object of this invention to provide a direct current amplifier having essentially drift free characteristics which is compact and which has high reliability characteristics.

Figure 2:
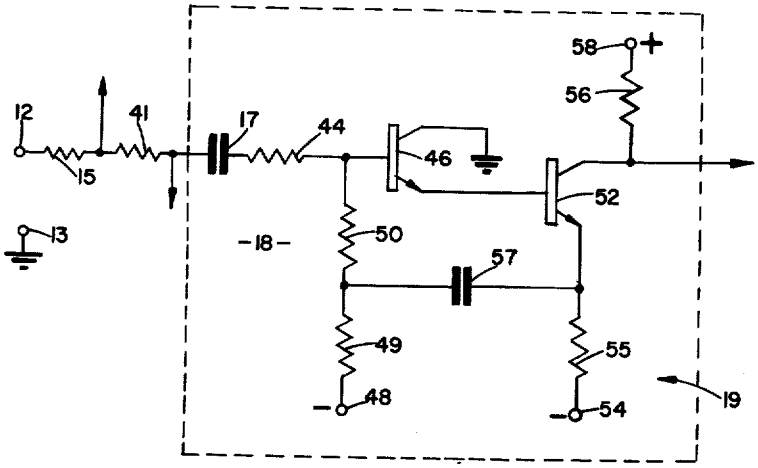
Figure 3:
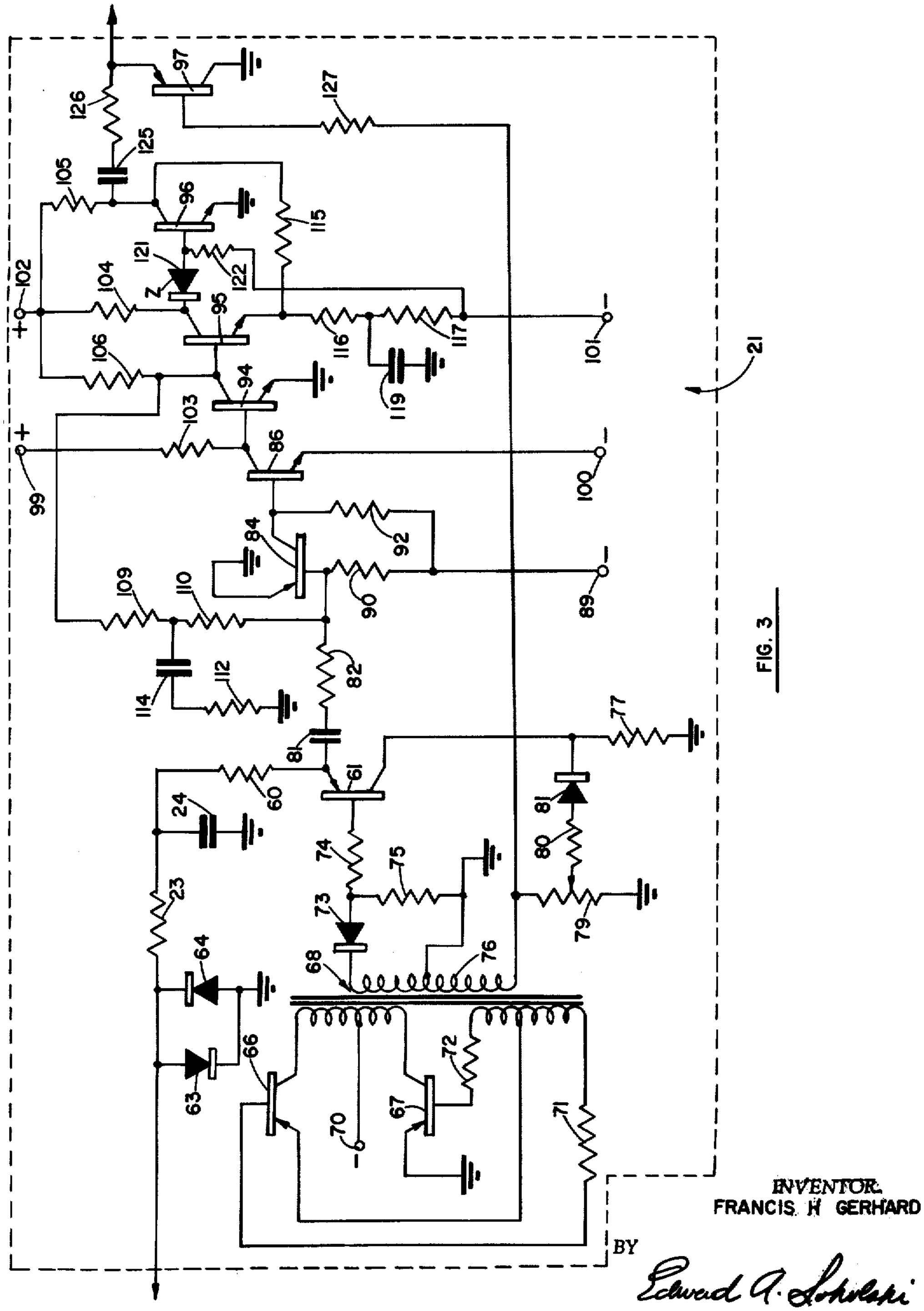
Figure 5:
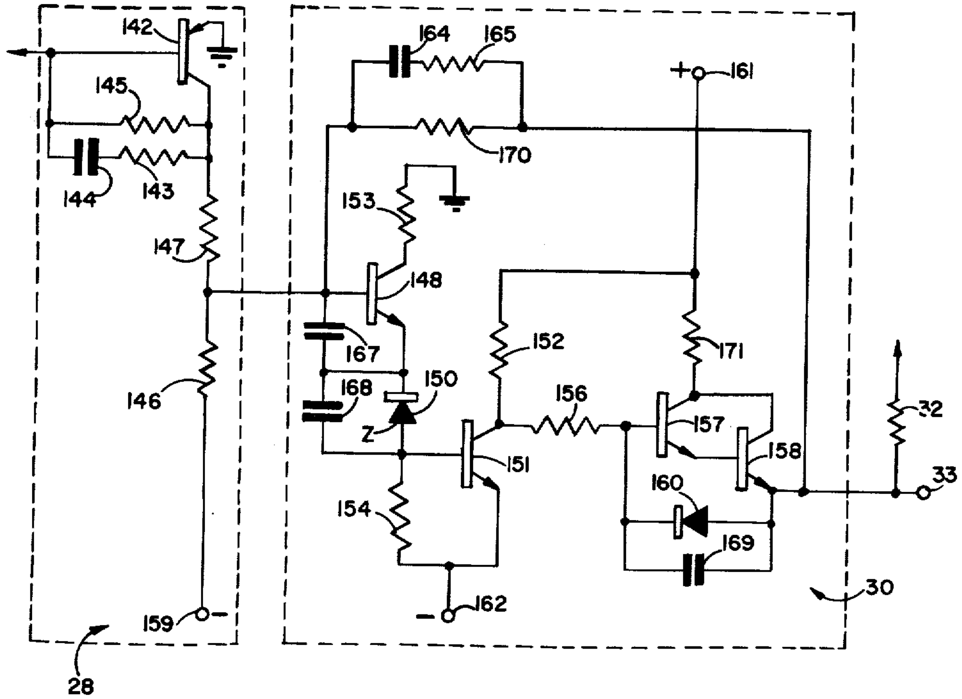
Figure 4:
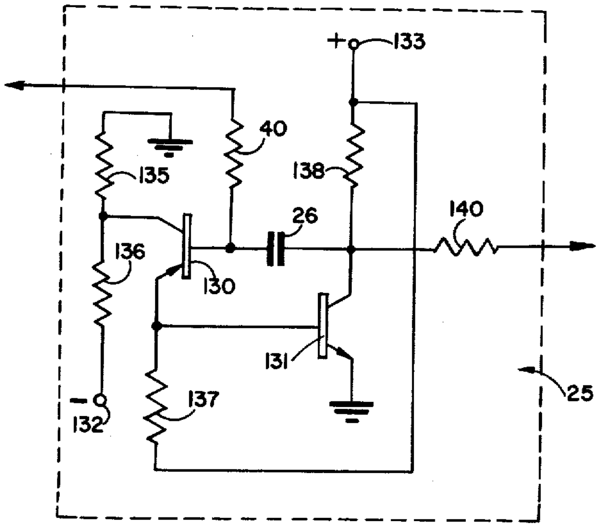

Other objects of this invention will become apparent from the following description taken in connection with the accompanying drawings in which FIG. 1 is a functional block diagram of the device of the invention, FIG. 2 is a schematic diagram of a preferred embodiment of the alternating current preamplifier of the device of the invention, FIG. 3 is a schematic diagram of a preferred embodiment of the chopper amplifier of the device of the invention, FIG. 4 is a schematic diagram of a preferred embodiment of the integrating amplifier of the device of the invention, and FIG. 5 is a schematic diagram of a preferred embodiment of the summing and direct coupled amplifiers of the device of the invention.

Referring to FIG. 1, a functional block diagram of the device of this invention is illustrated. Input signals are fed between terminals 12 and 13. Alternating current components of the input signals above a predetermined "crossover" frequency (which may be around 20 cycles for example) are fed through input resistor 15 and the coupling network comprising capacitor 17 and resistor 18, which represents the input resistance of the alternating current preamplifier 19. Substantially all of the components of the input signal below the predetermined "crossover" frequency are fed to chopper amplifier 21, most of the high frequency components of the signal being filtered out of this channel by the filter composed of resistor 23 and capacitor 24.

In the chopper amplifier, the substantially direct current components of the signal (including alternating current components which have not been filtered out by the input R-C filter network) are impressed upon a carrier generated in an oscillator circuit. The modulated carrier is amplified and then demodulated to give an amplified output which corresponds to the chopper amplifier input signal.

The demodulated signal is fed through resistor 40 to the input of integrating amplifier 25. The integrating amplifier substantially filters out all components of the signal above the predetermined "cross-over" frequency. This amplifier may take the form of a miller integrator which by means of frequency sensitive negative feedback establishes a very effective low pass filter without the use of large values of capacitance and resistance. The output voltage of the miller integrator varies as the function of the input voltage times the reactance of capacitor 26 divided by the resistance of resistor 40. The effective time constant of the miller integrator is equal to the product of its gain, the feedback capacitance and its input resistor, i.e., the product of the gain of the amplifier 25 times the capacitance of capacitor 26 and the resistance of resistor 40. It is therefore possible to achieve a relatively long time constant filter with relatively low values of resistance and capacitance by virtue of the gain of the integrating amplifier. Thus, it can be seen that very effective low pass filter action can be achieved using the feedback characteristics of the amplifier with a relatively low value feedback capacitor and input resistor. It is to be noted that the filtering action of amplifier 25 should cut off all amplifier response at frequencies above about 100 kc. to avoid oscillation of the circuitry which might otherwise be caused by transistor alpha cutoff, parasitic effects, or the like. The outputs of amplifiers 19 and 25 are fed to summing means 28, the summed output of summing means 28 being fed to direct coupled output power amplifier 30. Overall negative feedback is taken from output terminal 33 and fed through resistor 32 to the junction between resistor 15 and capacitor 17. The overall gain of the system is a function of the ratio of the resistance of resistor 32 to the input resistor 15. Generally, to achieve adequate stability and low drift, the direct current amplifier is not operated with overall gains in excess of 5.

The crossover frequency is defined as the frequency at which the gain of the channel which comprises alternating current preamplifier 19 is equal to that of the channel comprising the chopper amplifier 21 and the integrating amplifier 25. It can be shown that $$A_c \approx \frac{1}{2\pi f_c R_1 C_1} \quad (1)$$

where $A_c$=the gain of the integrating amplifier 25 at crossover
$f_c$=the frequency of crossover
$R_1$=the resistance of resistor 40
$C_1$=the capacitance of capacitor 26

Therefore at the crossover frequency $$A_4 = A_1 \cdot \frac{1}{2\pi F_c R_1 C_1} \quad (2)$$

where $A_4$ is the gain of alternating current preamplifier 19
$A_1$ is the gain of chopper amplifier 21 and $$R_1 C_1 = \frac{1}{A_4} \cdot \frac{A_1}{2\pi F_c} \quad (3)$$

It thus can be seen that the required value for the product $R_1C_1$ at the crossover frequency is reduced by a factor of the gain $A_4$ of amplifier 19. The use of preamplifier 19 thereby enables the use of smaller values for resistor 40 and capacitor 26. It can be shown that $$\frac{E_o}{E_{in}} = -A_2 A_3 \left[ \frac{A_4}{A_2} \cdot \frac{\tau_2 S}{\tau_2 S + 1} + A_1 \cdot \frac{1}{A_2 \tau_1 S + 1} \right] \quad (4)$$

where $E_o$=the output voltage of the entire direct current amplifier (at terminal 33)
$E_{in}$=the voltage input to the amplifier (at the junction between resistor 15 and resistor 23)
$-A_2$=the gain of integrating amplifier 25
$A_3$=the gain of direct coupled output power amplifier 30
$-A_4$=the gain of alternating current preamplifier 19
$A_1$=the gain of chopper amplifier 21
$\tau_1$=the resistance of resistor 40 times the capacitance of capacitor 26
$\tau_2$=the resistance of resistor 18 times the capacitance of capacitor 17
$S$=the Laplace operator In designing the amplifier the various gain and time constant requirements may be established as follows: The D.-C. gain of the complete amplifier is established by the accuracy requirements of the application (a representative gain might be about $10^7$). The gain of the chopper amplifier 21 determines the D.-C. drift error of the system and therefore is also dictated by the system accuracy requirements (a representative gain might be about 2,000). The resistance of resistor 40 is made as large as possible consistent with problems associated with vacuum tube or transistor direct current input currents and the input impedance of integrating amplifier 25. The capacitance of capacitor 26 is made as large as possible consistent with space requirements. The gain amplifier 25 is made as large as necessary to achieve cutoff of the entire amplifier at about 100 kc. (a representative gain might be about 500). The gain of preamplifier 19 is made as large as necessary to achieve the crossover frequency requirement (for example, a gain of 500 for crossover at 20 cycles per second). The gain of the output power amplifier 30 is made as large as necessary to meet the overall D.-C. gain requirement of the amplifier.

The amplifier may be used in either vacuum tube or transistor circuitry, although as pointed out, it exhibits its greatest advantages where utilized with transistorized circuitry. Accordingly, a schematic diagram of a preferred embodiment of the invention utilizing transistorized circuitry is shown in FIGS. 2, 3, 4, and 5 for illustrative purposes.

Referring to FIG. 2 the input signals are fed between terminals 12 and 13. The alternating current components of the signal are fed through resistor 15, resistor 41, capacitor 17 and resistor 44 to the base of transistor 46. Capacitor 17 blocks the passage of direct current from the transistor bias circuit to the input circuit and also effectively blocks the D.-C. and very low frequency alternating current components of the input signal from the transistor base. Resistor 44 acts as a damper to the signals and thereby tends to stabilize the alternating current preamplifier 19 against non-linear oscillations. Bias is supplied to the base of transistor 46 through terminal 48 and resistors 49 and 50. Transistor 46 is operated as an emitter follower with its collector grounded and its emitter directly coupled to the base of transistor 52. Operating potenials for the transistors are applied between terminals 54 and 58. Resistor 55 serves as an emitter resistor while resistor 56 serves as the collector resistor for transistor 52. Capacitor 57 is connected between the emitter of transistor 52 and the junction between resistors 49 and 50. Capacitor 57 provides positive feedback which effectively raises the input impedance of alternating current preamplifier 19. This capacitor also effectively serves as a bypass for emitter resistor 55, resistor 49 being of a relatively low value. The output of alternating current preamplifier 19 is coupled from the collector of transistor 52 to summing amplifier 28.

Referring to FIG. 3, which is a schematic of the chopper-amplifier, the direct current and low frequency alternating current components of the signal are coupled from the junction between the resistor 41 and capacitor 17 (FIG. 2) through resistor 23 and resistor 60 to the emitter of transistor 61. Capacitor 24 and resistor 23 form a filter network which filters out the high frequency components of the input signal. Diodes 63 and 64 which are connected between the input line and ground operating in conjunction with resistors 23 and 60 act as a damper circuit which tends to stabilize the chopper amplifier 21 against non-linear oscillation. Transistors 66 and 67 operate in conjunction with saturable transformer 68 as a free running saturable reactor multivibrator. Operating potentials for the multivibrator are supplied between terminal 70 and ground. Resistor 71 and 72 function as base biasing resistors for transistors 66 and 67, respectively. The transistors 66 and 67 conduct alternately for a period of time which is a function of the saturation time of the core of transformer 68. This provides a reliable low frequency oscillator which may have an output in the neighborhood of 300 cycles.

The output of the multivibrator is a square wave which is coupled to secondary winding 76 of transformer 68. The negative half cycle of this square wave is coupled through diode 73 and resistor 74 to the base of transistor 61. Resistor 75 is the base bias resistor for transistor 61. Transistor 61 operates as a chopper or switching circuit. During the negative half cycle of the square wave signal appearing at the base of transistor 61, the base to emitter junction of transistor 61 is forward biased, driving the transistor switch to saturation. Under this condition, the collector to emitter resistance of transistor 61 is very small with respect to isolating resistor 60 for either polarity of voltage applied across the emitter and collector which are the terminals of the switch. Therefore when the transistor switch is closed, the voltage at the emitter of transistor 61 which is the input voltage is effectively shorted to ground through low resistance resistor 77. During the positive half cycle of the square wave switching voltage as appearing at the top end of winding 76, diode 73 effectively blocks the passage of any signal, and transistor 61 is kept substantially non-conductive. With the switch in this non-conductive state, therefore, the total input voltage will appear at the emitter of transistor 61.

It has been found that when the transistor switch is in its non-conductive state it acts as a voltage generator due to coupling between the base and the emitter and collector. Where low level signals are involved, and precision is of the utmost importance as in this particular application, some compensation must be made for such "off set" voltage signals. The circuitry comprising potentiometer 79, resistor 80, diode 81, and resistor 77 is used to compensate for such "off set" voltages. This circuit, in effect, generates a signal equal and opposite to the "off set" voltage generated by the transistor and thereby eliminates its presence in the output signal. Potentiometer 79 must be adjusted in practice so that there is no output voltage with zero input voltage at the emitter of transistor 61. The problems of "off set" errors and their method of elimination including the circuit shown in FIG. 2 are more thoroughly discussed in my co-pending application Serial Number 723,035 for Low Level Transistor Switching Circuit, filed March 21, 1958. This copending application also shows other means for eliminating offset which may be used in place of the circuit shown in FIG. 3.

The signal at the emitter of transistor 61, which is essentially a modulated signal having a peak amplitude equal to the input voltage and a carrier frequency as determined by the free running rate of the multivibrator, is coupled through coupling capacitor 81 and resistor 82 to the base of transistor 84. Transistor 84 operates as a straightforward amplifier with a grounded emitter and an output signal is fed from its collector to the base of transistor 86. Power is supplied to a negative voltage between terminal 89 and ground. Resistor 90 is a base resistor for transistor 84 while resistor 92 is the base resistor for transistor 86. Transistors 94, 95 and 96 are provided, operating as conventional cascaded amplifier stages to provide the necessary gain. Operating potentials for these stages is applied at terminals 99, 100, 101, and 102. Resistors 103, 104, 105, and 106 are all conventional collector resistors for their respective transistor stages. Bias stability is incorporated into the amplifier by two low pass networks providing negative feedback. The first of these feedback networks runs from the collector of transistor 94 to the base of transistor 84 and is composed of resistors 109, 110, and 112 and capacitor 114. The second of these networks runs from the collector of transistor 96 to the emitter of transistor 95 and is composed of resistors 115, 116, and 117 and capacitor 119. Zener diode 121 is used to establish base bias for transistor 96 in conjunction with the dropping resistors 104 and 122 respectively connected to the positive and negative power terminals 102 and 101. The amplified signals are coupled from the collector of transistor 96 through capacitor 125 and resistor 126 to the emitter of demodulator transistor 97. Demodulation is accomplished by feeding a square wave from the bottom end of transformer winding 76 which is 180° out of phase with the voltage which keys the chopper. This square wave signal which should be relatively large to prevent large positive input voltages to the emitter of transistor 97 from switching the transistor is fed through resistor 127 to the base of transistor 97. The square wave signal causes transistor 97 to switch to saturation and to cut off in synchronism with the modulated carrier appearing at the emitter of the transistor and thereby effects demodulation of the input signal in conventional fashion.

Referring to FIG. 4, the demodulated output signal is fed from the emitter of transistor 97 (FIG. 3) through resistor 40 to the base of transistor 130 of the integrating amplifier. This transistor is connected as an emitter follower and the output signal is fed from its emitter to the base of transistor 131 which is operated in common emitter configuration. Operating potentials for the two transistors, which comprise the stages of integrating amplifier 25, are fed in at terminals 132 and 133. Resistors 135 and 136 form a voltage divider between terminal 132 and ground which is used to obtain the proper operating potential for the collector of transistor 130. Resistors 137 and 138 are voltage dropping resistors for the base and collector respectively of transistor 131. Negative feedback is provided from the collector of transistor 131 to the base of transistor 130 by means of feedback capacitor 26. As already explained, such negative feedback enables the integrating amplifier to act as a low pass filter, the effective time constant of the integrating amplifier being equal to the gain of the amplifier times the capacitance of capacitor 26 and the resistance of input resistor 40. A time constant of approximately 12 seconds may be obtained by the use of a 2 microfarad condenser for capacitor 26 and a 30,000 ohm resistor for resistor 40 with a gain of about 200 in the circuit illustrated. Transistor 130 may be a pnp type while transistor 131 may be an npn type to provide cancellation of base to emitter voltage variations which are a function of ambient temperature. The base current of transistor 130 may be minimized by employing a pnp silicon transistor which has high direct current "beta" at low collector current. The minimization of base to emitter voltage variations, as well as the reduction of the input base current with resultant smaller magnitude variations is essential in order to minimize offset errors. The output of integrating amplifier 25 is fed from the collector of transistor 131 through resistor 140 to the base of transistor 142 (FIG. 5).

Referring to FIG. 5, transistor 142 is the single stage of summing amplifier 28 which sums the outputs of integrating amplifier 25 from resistor 140 (FIG. 4) and alternating current preamplifier 19 at the collector of transistor 52 (FIG. 2). Resistor 145 provides for base bias for transistor 142 while resistors 146 and 147 act as voltage dropping resistors for the collector voltage fed to transistor 142 and the base bias for transistor 148. The output of summing amplifier 142 is coupled from the junction between resistors 146 and 147 to the base of power amplifier transistor 148. Negative feedback is provided from the collector of transistor 142 to the base of this transistor by means of resistor 143 and capacitor 144. This feedback circuit operates as a phase control network which is designed to reduce undesirable effects on frequency response due to transistor beta cutoff and collector capacitances as well as parasitic capacitances. Transistor 148 operates as an emitter follower, its output being fed through zener diode 150 to the base of the transistor 151. Zener diode 150 is used to establish proper base bias voltage for transistor 151. Resistors 152, 153, and 154 are used for current limiting purposes.

Transistors 151, 157, and 158 form a novel output power amplifier stage which has greatly improved efficiency.

This circuit is described in detail in my co-pending application Serial Number 776,834 for Direct Coupled Power Amplifier, filed November 28, 1958. With a negative input to the base of transistor 157, diode 160 is forward biased, providing a low resistance path for the output from the collector of common emitter stage 151 to output terminal 33. The base-emitter junctions of transistors 157 and 158 are back biased and therefore both of these transistors are cut off. The circuit therefore functions as a common emitter output stage. With a positive input to the base of transistor 157, diode 160 is back biased and the output circuit is comprised by emitter followers 157 and 158 in cascade. As is explained in detail in co-pending application Serial Number 776,834, this circuit thereby enables the utilization of the best features of an emitter follower for negative outputs and a common emitter for positive outputs.

The suppply voltages for the summing and power amplifiers are fed to terminals 159, 161, and 162 in the polarities indicated. To increase stability, negative feedback is provided from the emitter of transistor 158 to the base of transistor 148 through the network comprised by capacitor 164 and resistors 165 and 170. Capacitors 167, 168, and 169 are utilized to stabilize the local feedback loops around transistors 148, 151, 157, and 158. Resistor 171 is used for current limiting.

Overall negative feedback is provided from output terminal 33 through resistors 32 and 15 to input terminal 12 (FIG. 2). The value of feedback resistor 32 is chosen for the maximum stability and linear response commensurate with desired voltage gain in the amplifier, if any. Experience has indicated that for very linear response and gain stability, the overall amplifier should generally be operated with negative feedback to give voltage gains of between one and five. The stability and linearity will, of course, be best at the lower gains and vice versa. Typical components values for the embodiment shown in FIG. 2 might be as follows:

| | |
|---|---|
| Transistors **66**, **67**, **84**, **97** and **142** | Philco Type T1501. |
| Transistor **61** | Philco Type T1507. |
| Transistors **86**, **94**, **95**, **96**, **131** **46**, **52**, **148** | Texas Instrument Company Type 2N335. |
| Transistor **130** | Raytheon Type 2N329A. |
| Transistors **151**, **157**, **158** | Texas Instrument Company Type J317. |
| Diodes **73**, **63**, **64** | Type 1N251. |
| Diodes **81**, **160** | Type 1N497. |
| Zener diode **121** | Type SV–13. |
| Zener diode **150** | Type SV–24. |
| Resistor **82** | 1 megohm. |
| Resistor **60** | 500 kilohms. |
| Resistor **145** | 360 kilohms. |
| Resistor **56** | 300 kilohms. |
| Resistor **90** | 240 kilohms. |
| Resistor **136** | 220 kilohms. |
| Resistors **170**, **137** | 200 kilohms. |
| Resistors **15**, **32**, **44**, **109**, **23** | 100 kilohms. |
| Resistors **50**, **55** | 82 kilohms. |
| Resistors **117**, **135** | 68 kilohms. |
| Resistors **41**, **106**, **110**, **115** | 47 kilohms. |
| Resistor **140** | 39 kilohms. |
| Resistor **143** | 36 kilohms. |
| Resistors **92**, **138** | 33 kilohms. |
| Resistors **146**, **104**, **127**, **40** | 30 kilohms. |
| Resistor **74**, | 27 kilohms. |
| Resistor **147** | 20 kilohms. |
| Resistors **105**, **106** | 15 kilohms. |
| Resistors **75**, **80**, **152** | 10 kilohms. |
| Resistor **103** | 6.8 kilohms. |
| Resistor **153** | 4.7 kilohms. |
| Resistors **154**, **72**, **71**, **165** | 1 kilohm. |
| Resistors **49**, **156**, **171** | 200 ohms. |

| | |
|---|---|
| Resistors **112**, **116** | 150 ohms. |
| Resistor **77** | 2 ohms. |
| Potentiometer **79** | 20 kilohms. |
| Capacitor **57** | 120 microfarads. |
| Capacitors **114**, **119** | 22 microfarads. |
| Capacitor **168** | 4.7 microfarads. |
| Capacitors **17**, **26** | 2 microfarads. |
| Capacitor **169** | .01 microfarad. |
| Capacitor **125** | .068 microfarad. |
| Capacitor **144** | .0015 microfarad. |
| Capacitor **81** | .0022 microfarad. |
| Capacitor **164** | .0027 microfarad. |
| Capacitors **167**, **24** | .0047 microfarad. |
| Voltage applied to terminals **54**, **159**, **162**, **101** and **132** | −55 volts. |
| Voltage applied to terminals **58**, **161**, **102** and **133** | +55 volts. |
| Voltage applied to terminals **48** and **89** | −14 volts. |
| Voltage applied to terminal **70** | −10 volts. |
| Voltage applied to terminal **99** | +7 volts. |
| Voltage applied to terminal **100** | −7 volts. |

Direct coupled amplifiers have been built utilizing the transistorized circuitry indicated in FIGS. 2, 3, 4, and 5 which are capable of computing accuracies of .005% over an ambient temperature range of minus 550 C. to plus 85° C. It thus can be seen that the device of this invention enables the construction of a rugged, compact and reliable amplifier having very high stability and low drift.

While the device of this invention has been illustrated and described in detail, it is to be clearly understood that the same is by way of illustration and example only and it not to be taken by way of limitation, the spirit and scope of this invention being limited only by the terms of the appended claims.

I claim:

1. In a stabilized direct current amplifier, a first channel for amplifying substantially only alternating current signals above a predetermined crossover frequency to a predetermined cutoff frequency, a second channel for amplifying substantially only signals to direct current below said predetermined crossover frequency, an input terminal connected to the inputs of said first and second channel, said second channel comprising a chopper amplifier comprising means for converting a direct current signal to an alternating current signal, means for amplifying said alternating current signal, means for rectifying said amplified alternating current signal, and an integrating amplifier adapted to function as a low pass filter connected in cascade with said chopper amplifier, means for summing the outputs of said first and second channels, a direct coupled amplifier, the output of said summing means being connected to said direct coupled amplifier, said direct coupled amplifier comprising a transistorized output stage and means for alternatively connecting said output stage in common emitter configuration with negative output signals or emitter follower configuration with positive output signals, and means for providing negative feedback from the output of said direct coupled amplifier to the inputs of said first and second channels, whereby the output of said direct coupled amplifier is stabilized and has a drift free direct current component.

2. In a transistorized stabilized direct current amplifier, a first channel for amplifying substantially only alternating current signals above a predetermined crossover frequency to a predetermined cutoff frequency, a second channel for amplifying substantially only signals to direct current below said predetermined crossover frequency, an input terminal connected to the inputs of said first and second channels, said second channel comprising a transistorized chopper amplifier and transistorized integrated amplifier means for providing a low pass filter connected in cascade with said chopper amplifier, means for summing the outputs of said first and second channels, and a transistorized direct coupled amplifier comprising an output stage and means for alternatively connecting said output stage in common emitter configuration with negative output signals or emitter follower configuration with positive output signals.

3. The device as recited in claim 2 wherein said integrating amplifier means comprises capacitive means for providing negative feedback from the amplifier output to the amplifier input.

4. The device as recited in claim 2 and additionally comprising means for providing negative feedback from the output of said direct coupled amplifier to the inputs of said first and second channels.

References Cited in the file of this patent

UNITED STATES PATENTS

| | | |
|---|---|---|
| 2,663,830 | Oliver | Dec. 22, 1953 |
| 2,730,573 | Sedgfield et al. | Jan. 10, 1956 |
| 2,744,169 | Deming | May 1, 1956 |
| 2,778,883 | Buckerfield | Jan. 22, 1957 |
| 2,919,409 | Williams | Dec. 29, 1959 |
| 2,934,709 | Williams | Apr. 26, 1960 |
| 2,953,752 | Porter | Sept. 20, 1960 |

OTHER REFERENCES

Goldberg: RCA Review, June 1950, pages 296–300.

Korn et al.: Electronic Analog Computers, published by McGraw-Hill Book Co., Inc., New York, in 1952, pages 11, 16, 17 and 18.